United States Patent
Shin et al.

(10) Patent No.: US 8,295,114 B2
(45) Date of Patent: Oct. 23, 2012

(54) SEMICONDUCTOR MEMORY CELL ARRAY INCLUDING DUMMY BIT-LINE AND WORD-LINE AND SEMICONDUCTOR MEMORY DEVICE HAVING THE SAME

(75) Inventors: Sang-Woong Shin, Seongnam-si (KR); Seong-Jin Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 306 days.

(21) Appl. No.: 12/656,984

(22) Filed: Feb. 22, 2010

(65) Prior Publication Data

US 2010/0214861 A1    Aug. 26, 2010

(30) Foreign Application Priority Data

Feb. 26, 2009   (KR) .................. 10-2009-0016352

(51) Int. Cl.
    *G11C 7/02* (2006.01)
(52) U.S. Cl. ............ 365/210.1; 365/205; 365/149

(58) Field of Classification Search ............ 365/149, 365/205, 210.1
See application file for complete search history.

(56) References Cited

U.S. PATENT DOCUMENTS

| 5,850,364 | A | 12/1998 | Ueno | |
|---|---|---|---|---|
| 7,405,960 | B2 | 7/2008 | Cho et al. | |
| 2007/0041260 | A1* | 2/2007 | Hong et al. | 365/208 |
| 2007/0058413 | A1* | 3/2007 | Lin et al. | 365/145 |
| 2008/0112208 | A1* | 5/2008 | Cho et al. | 365/148 |

FOREIGN PATENT DOCUMENTS

| JP | 10-125805 A | 5/1998 |
|---|---|---|
| KR | 10-2007-0036575 A | 4/2007 |
| KR | 10-0827706 B1 | 4/2008 |

* cited by examiner

*Primary Examiner* — Hoai V Ho
(74) *Attorney, Agent, or Firm* — Lee & Morse, P.C.

(57) ABSTRACT

A semiconductor memory cell array includes a plurality of bit-lines, a plurality of word-lines, a plurality of memory cells, a plurality of dummy memory cells, a plurality of dummy bit-lines, and a plurality of dummy word-lines. The dummy bit-lines are in outer regions of the bit-lines. The dummy word-lines are in outer regions of the word-lines. The dummy bit-lines are maintained in a floating state. The dummy word-lines retain a turn-off voltage.

14 Claims, 5 Drawing Sheets

SEMICONDUCTOR MEMORY CELL ARRAY INCLUDING DUMMY BIT-LINE AND WORD-LINE AND SEMICONDUCTOR MEMORY DEVICE HAVING THE SAME

BACKGROUND

1. Technical Field

Example embodiments relate to a semiconductor device and, more particularly, to a semiconductor memory cell array and a semiconductor memory device having the same.

2. Description of the Related Art

Generally, a semiconductor memory cell array includes a plurality of memory cells, a plurality of word-lines, and a plurality of bit-lines. Memory cells arranged in edge regions of the semiconductor memory cell array are used as dummy memory cells because the memory cells arranged in edge regions of the semiconductor memory cell array might not achieve characteristics required for normal operations. The dummy memory cells are coupled to a plurality of dummy word-lines and a plurality of dummy bit-lines.

As demand for higher integration degree and lower power consumption of the semiconductor memory device increases, noise caused by the dummy word-lines, the dummy bit-lines, and/or the dummy memory cells may negatively influence operation of actual memory cells in the semiconductor memory device.

SUMMARY

Embodiments are therefore directed to semiconductor memory cell array and device, which substantially overcome one or more of the problems due to the limitations and disadvantages of the related art.

It is therefore a feature of an embodiment to provide a semiconductor memory cell array capable of reducing noise caused by dummy word-lines, dummy bit-lines, and/or dummy memory cells when a semiconductor memory device operates using a low operation voltage.

It is therefore another feature of an embodiment to provide a semiconductor memory device having the semiconductor memory cell array.

At least one of the above and other features and advantages may be realized according to some example embodiments by providing a semiconductor memory cell array may include a plurality of bit-lines, a plurality of word-lines, a plurality of memory cells, a plurality of dummy memory cells, a plurality of dummy bit-lines, and a plurality of dummy word-lines. The memory cells may be arranged in regions corresponding to intersecting points of the bit-lines and the word-lines. The dummy memory cells may be arranged in edge regions of the semiconductor memory cell array. The dummy bit-lines may be maintained in a floating state. The dummy bit-lines may be formed in outer regions of the bit-lines. The dummy word-lines may receive a turn-off voltage. The dummy word-lines may be formed in outer regions of a plurality of word-lines.

In some embodiments, the dummy memory cells coupled to the dummy bit-lines may be maintained in the floating state.

In some embodiments, wherein the dummy memory cells coupled to the dummy word-lines may be maintained in a turn-off state.

In some embodiments, the dummy memory cells may include a plurality of sub-dummy memory cells that are arranged in regions corresponding to intersecting points of the bit-lines and the dummy word-lines. A junction floating may be conducted between the sub-dummy memory cells and the bit-lines.

In some embodiments, the semiconductor memory cell array may be a dynamic random access memory (DRAM) memory cell array.

In some embodiments, the semiconductor memory cell array may be implemented as one of an open bit-line structure and a folded bit-line structure.

According to some example embodiments, a semiconductor memory cell array may include a plurality of bit-lines, a plurality of word-lines, a plurality of memory cells, a plurality of dummy memory cells, a plurality of first dummy bit-lines, a plurality of second dummy bit-lines, and a plurality of dummy word-lines. The memory cells may be arranged in regions corresponding to intersecting points of the bit-lines and the word-lines. The dummy memory cells may be arranged in edge regions of the semiconductor memory cell array. The first dummy bit-lines may receive an internal voltage. The first dummy bit-lines may be formed in outer regions of the bit-lines. The second dummy bit-lines may be maintained in a floating state. The second dummy bit-lines may be formed in outer regions of the first dummy bit-lines. The dummy word-lines may receive a turn-off voltage. The dummy word-lines may be formed in outer regions of the word-lines.

In some embodiments, the dummy memory cells coupled to the second dummy bit-lines may be maintained in the floating state.

In some embodiments, the dummy memory cells coupled to the dummy word-lines may be maintained in a turn-off state.

In some embodiments, the dummy memory cells may include a plurality of sub-dummy memory cells that are arranged in regions corresponding to intersecting points of the bit-lines and the dummy word-lines. A junction floating may be conducted between the sub-dummy memory cells and the bit-lines.

In some embodiments, the first dummy bit-lines may be dummy bit-lines that are adjacent to the bit-lines.

In some embodiments, the second dummy bit-lines may be dummy bit-lines that are away farthest from the bit-lines.

In some embodiments, the semiconductor memory cell array may be a DRAM memory cell array.

In some embodiments, the semiconductor memory cell array may be implemented as one of an open bit-line structure and a folded bit-line structure.

According to some example embodiments, a semiconductor memory device may include a semiconductor memory cell array, a row decoder, a column decoder, a sense amplifier, and a data input driver. The row decoder may determine a word-line for selecting a memory cell. The column decoder may determine a bit-line for selecting a memory cell. The sense amplifier may read data from a memory cell selected by the row decoder and the column decoder. The data input driver may write data into a memory cell selected by the row decoder and the column decoder. The semiconductor memory cell array may include a plurality of bit-lines, a plurality of word-lines, a plurality of memory cells, a plurality of dummy memory cells, a plurality of dummy bit-lines, and a plurality of dummy word-lines. The memory cells may be arranged in regions corresponding to intersecting points of the bit-lines and the word-lines. The dummy memory cells may be arranged in edge regions of the semiconductor memory cell array. The dummy bit-lines may be maintained in a floating state. The dummy bit-lines may be formed in outer regions of the bit-lines. The dummy word-lines may receive a turn-off voltage. The dummy word-lines may be formed in outer regions of the word-lines.

In some embodiments, the dummy memory cells coupled to the dummy bit-lines may be maintained in the floating state. The dummy memory cells coupled to the dummy word-lines may be maintained in a turn-off state.

In some embodiments, the dummy memory cells may include a plurality of sub-dummy memory cells that are arranged in regions corresponding to intersecting points of the bit-lines and the dummy word-lines. A junction floating may be conducted between the sub-dummy memory cells and the bit-lines.

In some embodiments, the semiconductor memory device may be a DRAM device.

In some embodiments, the semiconductor memory cell array may be implemented as one of an open bit-line structure and a folded bit-line structure.

According to some example embodiments, a semiconductor memory device may include a semiconductor memory cell array, a row decoder, a column decoder, a sense amplifier, and a data input driver. The row decoder may determine a word-line for selecting a memory cell. The column decoder may determine a bit-line for selecting a memory cell. The sense amplifier may read data from a memory cell selected by the row decoder and the column decoder. The data input driver may write data into a memory cell selected by the row decoder and the column decoder. The semiconductor memory cell array may include a plurality of bit-lines, a plurality of word-lines, a plurality of memory cells, a plurality of dummy memory cells, a plurality of first dummy bit-lines, a plurality of second dummy bit-lines, and a plurality of dummy word-lines. The memory cells may be arranged in regions corresponding to intersecting points of the bit-lines and the word-lines. The dummy memory cells may be arranged in edge regions of the semiconductor memory cell array. The first dummy bit-lines may receive an internal voltage. The first dummy bit-lines may be formed in outer regions of the bit-lines. The second dummy bit-lines may be maintained in a floating state. The second dummy bit-lines may be formed in outer regions of the first dummy bit-lines. The dummy word-line may receive a turn-off voltage. The dummy word-lines may be formed in outer regions of the word-lines.

In some embodiments, the dummy memory cells coupled to the second dummy bit-lines may be maintained in the floating state. The dummy memory cells coupled to the dummy word-lines may be maintained in a turn-off state.

In some embodiments, the dummy memory cells may include a plurality of sub-dummy memory cells that are arranged in regions corresponding to intersecting points of the bit-lines and the dummy word-lines. A junction floating may be conducted between the sub-dummy memory cells and the bit-lines.

In some embodiments, the semiconductor memory device may be a DRAM device.

In some embodiments, the semiconductor memory cell array may be implemented as one of an open bit-line structure and a folded bit-line structure.

In some embodiments, the first dummy bit-lines may be dummy bit-lines that are adjacent to the bit-lines.

In some embodiments, the second dummy bit-line may be dummy bit-lines that are away farthest from the bit-lines.

According to some example embodiments, a semiconductor memory cell array may reduce noise caused by dummy word-lines, dummy bit-lines, and/or dummy memory cells when a semiconductor memory device operates using a low operation voltage. Thus, the semiconductor memory cell array may prevent operation failures of memory cells due to the noise.

According to some example embodiments, a semiconductor memory device may achieve high operation reliability because a semiconductor memory cell array reduce noise caused by dummy word-lines, dummy bit-lines, and/or dummy memory cells when the semiconductor memory device operates using a low operation voltage.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0016352, filed on Feb. 26, 2009, in the Korean Intellectual Property Office, and entitled: "Semiconductor Memory Cell Array, and Semiconductor Memory Device Having the Same," is incorporated by reference herein in its entirety.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
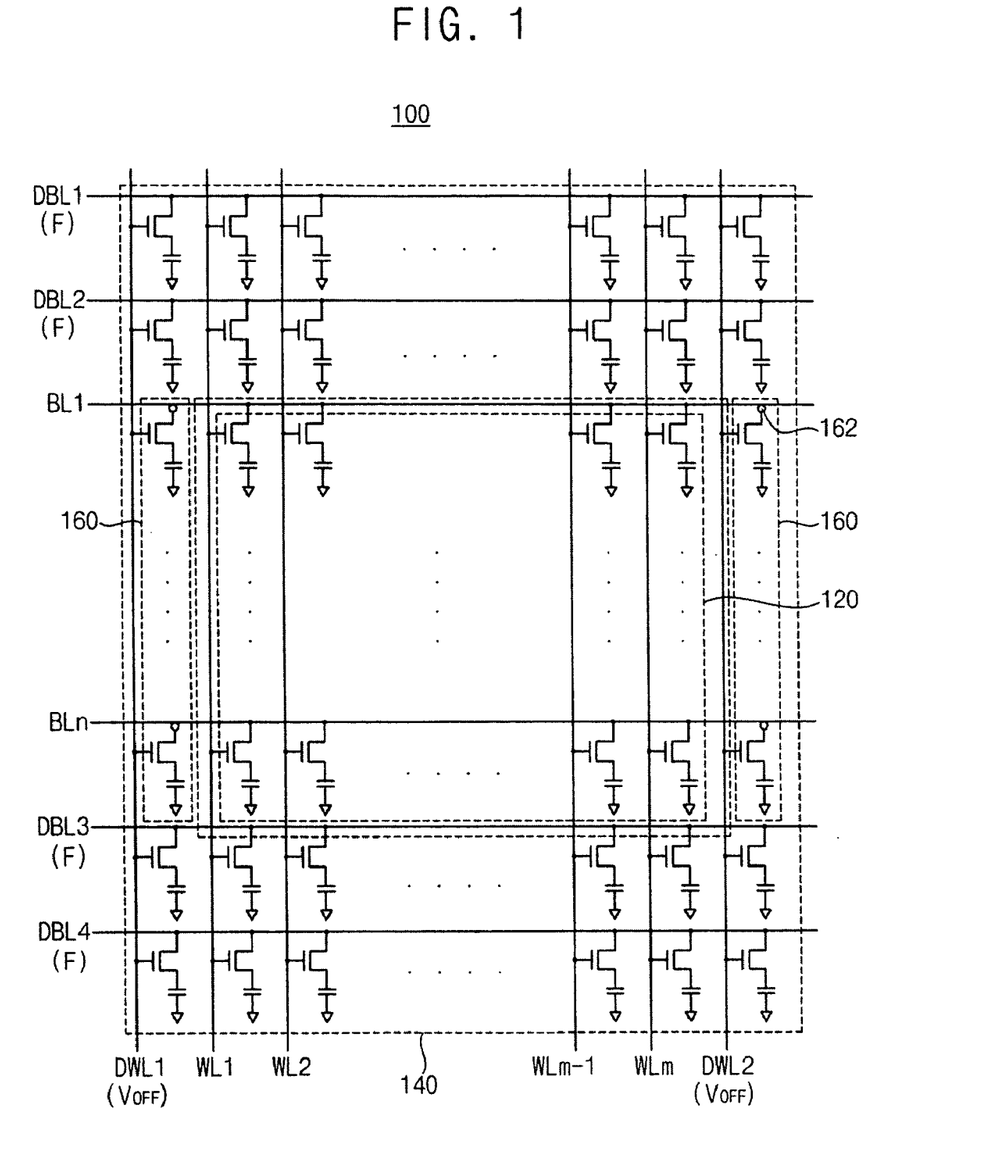
FIG. 1 illustrates a circuit diagram of a semiconductor memory cell array according to some example embodiments.

FIG. 1 illustrates a circuit diagram of a semiconductor memory cell array according to some example embodiments. Referring FIG. 1, the semiconductor memory cell array 100 may include a plurality of bit-lines BL1 through BLn, a plurality of word-lines WL1 through WLm, a plurality of memory cells 120, a plurality of dummy memory cells 140, a plurality of dummy bit-lines DBL1 through DBL4, and a plurality of dummy word-lines DWL1 and DWL2. The dummy memory cells 140 may include a plurality of sub-dummy memory cells 160 at intersections of the bit-lines BL1 through BLn and the dummy word-lines DWL1 and DWL2.

The memory cells 120 may be at intersections of the bit-lines BL1 through BLn and the word-lines WL1 through WLm. One of the memory cells 120 may be selected by a column decoder and a row decoder. In detail, data may be written into the memory cells 120 or may be read from the memory cells 120 based on voltages applied into the bit-lines BL1 through BLn and the word-lines WL1 through WLm by the column decoder and the row decoder.

The semiconductor memory cell array 100 may be a dynamic random access memory (DRAM) cell array as illustrated in FIG. 1. The semiconductor memory cell array 100 in the DRAM device may be implemented as one of an open bit-line structure or a folded bit-line structure. Because the semiconductor memory cell array 100 shown in FIG. 1 is one example embodiment, the structure of the semiconductor memory cell array 100 is not limited thereto.

In the semiconductor memory cell array 100, the bit-lines BL1 through BLn cross the word-lines WL1 through WLm. The memory cells 120 are at intersections of the bit-lines BL1 through BLn and the word-lines WL1 through WLm. Each of the memory cells 120 may include one capacitor and one transistor. Each transistor in the memory cells 120 may include a first terminal (e.g., a drain terminal) coupled to the bit-lines BL1 through BLn, a second terminal (e.g., a source terminal) coupled to each capacitor in the memory cells 120, and a third terminal (e.g., a gate terminal) coupled to the word-lines WL1 through WLm.

In the semiconductor memory cell array 100, the dummy memory cells 140 are at intersections of the dummy bit-lines DBL1 through DBL4 and the dummy word-lines DWL1 and DWL2, of the dummy bit-lines DBL1 through DBL4 and the word-lines WL1 through WLm, and of the bit-lines BL1 through BLn and the dummy word-lines DWL1 and DWL2. That is, the dummy bit-lines DBL1 through DBL4, the dummy word-lines DWL1 and DWL2, and the dummy memory cells 140 are arranged in edge regions of the semiconductor memory cell array 100, while the bit-lines BL1 through BLn, the word-lines WL1 through WLm, and the memory cells 120 are arranged in central regions of the semiconductor memory cell array 100.

It is relatively difficult to estimate electrical characteristics of the dummy bit-lines DBL1 through DBL4, the dummy word-lines DWL1 and DWL2, and the dummy cells 140 because the dummy bit-lines DBL1 through DBL4, the dummy word-lines DWL1 and DWL2, and the dummy cells 140 are arranged in edge regions of the semiconductor memory cell array 100. In the semiconductor memory cell array 100, the dummy bit-lines DBL1 through DBL4 are in outer regions of the bit-lines BL1 through BLn and parallel to the bit-lines BL1 through BLn. The dummy word-lines DWL1 and DWL2 are formed in outer regions of the word-lines WL1 through WLm while being in parallel to the word-lines WL1 through WLm. The sub-dummy memory cells 160 are at intersections of the bit-lines BL1 through BLn and the dummy word-lines DWL1 and DWL2.

According to some embodiments, the dummy bit-lines DBL1 through DBL4 are maintained in a floating state. According to some embodiments, a turn-off voltage is applied to the dummy word-lines DWL1 and DWL2 to maintain the dummy memory cells 140 coupled to the dummy word-lines DWL1 and DWL2 in a turn-off state.

Further, according to some embodiments, a junction floating 162 is conducted between the sub-dummy memory cells 160 and the bit-lines BL1 through BLn. For example, the sub-dummy memory cells 160 among the dummy memory cells 140 may be electrically separated from the bit-lines BL1 through BLn.

According to some embodiments, the dummy memory cells 140 coupled to the dummy word-lines DWL1 and DWL2 receive the turn-off voltage. That is, the turn-off voltage is applied into third terminals (e.g., gate terminals) of transistors in the dummy memory cells 140 coupled to the dummy word-lines DWL1 and DWL2. Thus, the dummy memory cells 140 coupled to the dummy word-lines DWL1 and DWL2 are maintained in the turn-off state. As first terminals (e.g., drain terminals) of transistors in the dummy memory cells 140 are coupled to the dummy bit-lines DBL1 through DBL4 that are maintained in the floating state, the dummy memory cells 140 coupled to the dummy bit-lines DBL1 through DBL4 are maintained in the floating state.

Further, according to some embodiments, as the junction floating 162 is conducted between the sub-dummy memory cells 160 and the bit-lines BL1 through BLn, influence between the sub-dummy memory cells 160 and the bit-lines BL1 through BLn may be reduced or prevented. That is, cross-talk may not occur between the sub-dummy memory cells 160 and the bit-lines BL1 through BLn. As a result, the dummy memory cells 140 in the semiconductor memory cell array 100 may be prevented from performing unwanted write operations and/or unwanted read operations. In addition, the dummy memory cells 140, the dummy bit-lines DBL1 through DBL4, and the dummy word-lines DWL1 and DWL2 may not have negative influences upon operations of the memory cells 120 in the semiconductor memory cell array 100.

Figure 2:
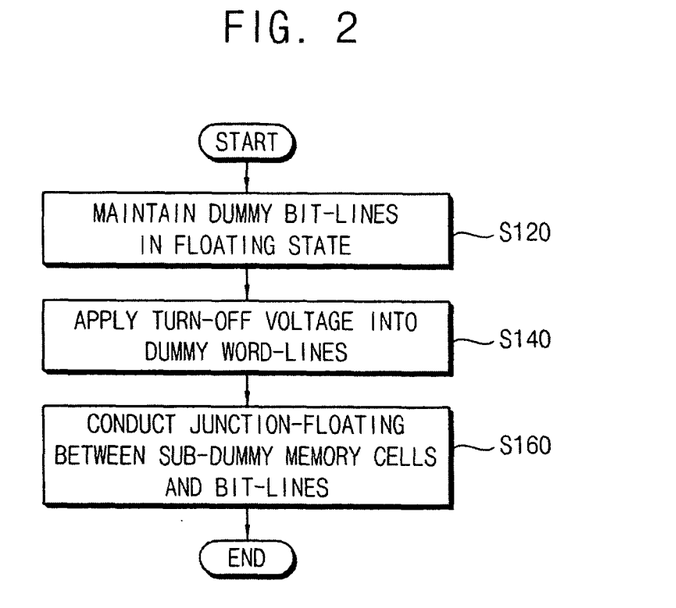
FIG. 2 illustrates a flow chart of a method of reducing noise caused by dummy word-lines, dummy bit-lines, and/or dummy memory cells in the semiconductor memory cell of FIG. 1.

FIG. 2 illustrates a flow chart of a method of reducing noise caused by dummy word-lines, dummy bit-lines, and/or dummy memory cells in the semiconductor memory cell of FIG. 1 in accordance with embodiments.

Referring to FIG. 2, in the method of reducing noise caused by the dummy word-lines DWL1 and DWL2, the dummy bit-lines DBL1 through DBL4, and/or the dummy memory cells 140 in the semiconductor memory cell 100, the dummy bit-lines DBL1 through DBL4 may be maintained in the floating state (operation S120). The turn-off voltage may be applied into the dummy word-lines DWL1 and DWL2 (operation S140). The junction floating 162 may be conducted between the sub-dummy memory cells 160 and the bit-lines BL1 through BLn (operation S160).

The dummy bit-lines DBL1 through DBL4 are maintained in the floating state (operation S120). Thus, the dummy memory cells 140 coupled to the dummy bit-lines DBL1 through DBL4 may be maintained in the floating state.

In addition, the turn-off voltage is applied into the dummy word-lines DWL1 and DWL2 (operation S140). Thus, the dummy memory cells 140 coupled to the dummy word-lines DWL1 and DWL2 may be maintained in the turn-off state.

Further, the junction floating 162 is conducted between the sub-dummy memory cells 160 and the bit-lines BL1 through BLn (operation S160). Thus, cross-talk between the sub-dummy memory cells 160 and the bit-lines BL1 through BLn may be reduced or eliminated. For example, the junction floating 162 may be conducted by electrically separating the sub-dummy memory cells 160 from the bit-lines BL1 through BLn.

The method of FIG. 2 may reduce or prevent operation failures of the memory cells 120 in the semiconductor memory cell array 100 by reducing noise caused by the dummy word-line DWL1 and DWL2, the dummy bit-lines DBL1 through DBL4, and/or the dummy memory cells 140.

Figure 3:
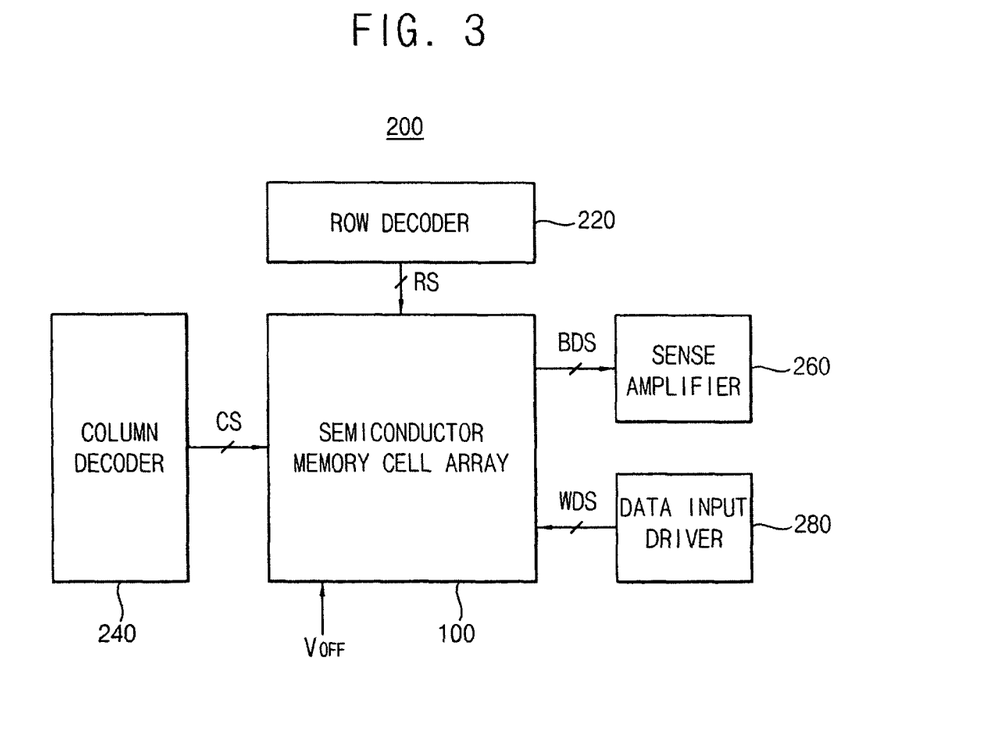
FIG. 3 illustrates a block diagram of a semiconductor memory device having the semiconductor memory cell array of FIG. 1.

FIG. 3 illustrates a block diagram of a semiconductor memory device 200 having the semiconductor memory cell array 100 of FIG. 1 according to embodiments. Referring to FIG. 3, the semiconductor memory device 200 may include the semiconductor memory cell array 100, a row decoder 220, a column decoder 240, a sense amplifier 260, and a data input driver 280.

As illustrated in FIG. 1, the semiconductor memory cell array 100 includes the bit-lines BL1 through BLn, the word-lines WL1 through WLm, the memory cells 120, the dummy memory cells 140, the dummy bit-lines DBL1 through DBL4, and the dummy word-lines DWL1 and DWL2. The dummy memory cells 140 may include the sub-dummy memory cells 160. The dummy bit-lines DBL1 through DBL4 are in outer regions of the bit-lines BL1 through BLn and parallel to the bit-lines BL1 through BLn. The dummy word-lines DWL1 and DWL2 are in outer regions of the word-lines WL1 through WLm and parallel to the word-lines WL1 through WLm. The sub-dummy memory cells 160 are at intersections of the bit-lines BL1 through BLn and the dummy word-lines DWL1 and DWL2. That is, the sub-dummy memory cells 160 are a portion of the dummy memory cells 140.

According to embodiments, the dummy bit-lines DBL1 through DBL4 are maintained in the floating state and the dummy word-lines DWL1 and DWL2 retain the turn-off voltage. The junction floating 162 is conducted between the sub-dummy memory cells 160 and the bit-lines BL1 through BLn. Here, the further descriptions of the semiconductor memory cell array 100 will be omitted because the semiconductor memory cell array 100 is described in detail above.

The row decoder 220 selects one among the word-lines WL1 through WLm to output a word-line selection signal RS to the semiconductor memory cell array 100. The column decoder 240 selects one among the bit-lines BL1 through BLn to output a bit-line selection signal CS to the semiconductor memory cell array 100. Thus, one of the memory cells 140 is selected by the word-line selection signal RS from the row decoder 220 and the bit-line selection signal CS from the column decoder 240. The sense amplifier 260 reads data BDS from one memory cell 140 selected by the row decoder 220 and the column decoder 240. The data input driver 280 writes data WDS into one memory cell selected by the row decoder 220 and the column decoder 240. According to some example embodiments, the sense amplifier 260 may perform the functions of the data input driver 280. Here, further description of the row decoder 220, the column decoder 240, the sense amplifier 260, and the data input driver 280 will be omitted, as operations of the row decoder 220, the column decoder 240, the sense amplifier 260, and the data input driver 280 are well-known in the art.

As described above, the semiconductor memory device 200 may achieve high operation reliability because the semiconductor memory cell array 100 reduces noise caused by the dummy word-lines DWL1 and DWL2, the dummy bit-lines DBL1 through DBL4, and/or the dummy memory cells 140 when the semiconductor memory device 200 operates using a low operation voltage.

Figure 4:
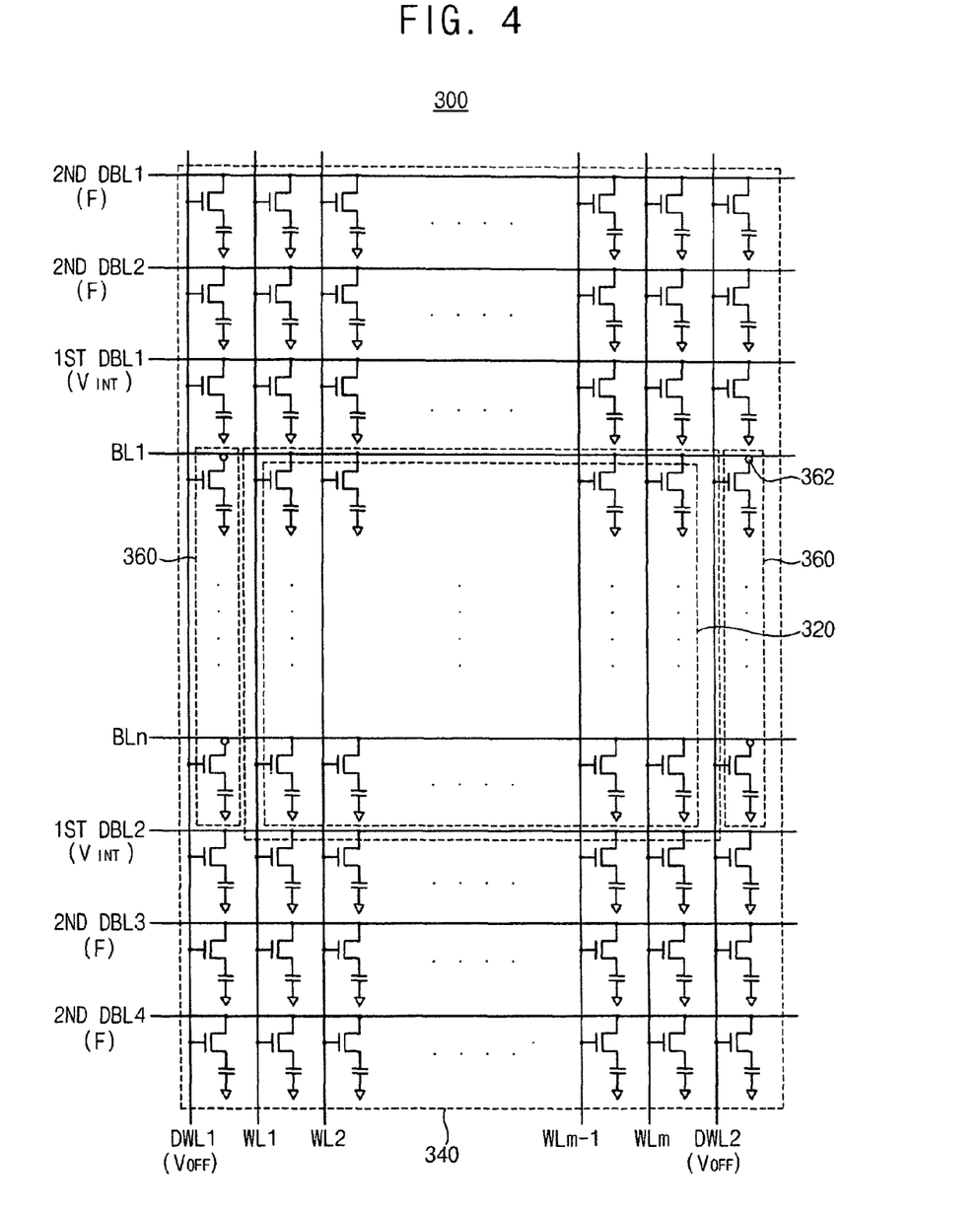
FIG. 4 illustrates a circuit diagram of a semiconductor memory cell array according to some example embodiments.

FIG. 4 illustrates a circuit diagram of a semiconductor memory cell array according to some example embodiments. Referring FIG. 4, the semiconductor memory cell array 300 may include the plurality of bit-lines BL1 through BLn, the plurality of word-lines WL1 through WLm, a plurality of memory cells 320, a plurality of dummy memory cells 340, a plurality of first dummy bit-lines 1ST DBL1 and 1ST DBL2, a plurality of second dummy bit-lines 2ND DBL1 through 2ND DBL4, and the plurality of dummy word-lines DWL1 and DWL2. The dummy memory cells 340 may include a plurality of sub-dummy memory cells 360 at intersections of the bit-lines BL1 through BLn and the dummy word-lines DWL1 and DWL2.

The memory cells 320 may be arranged at intersections of the bit-lines BL1 through BLn and the word-lines WL1 through WLm. One of the memory cells 320 may be selected by a column decoder and a row decoder. In detail, data may be written into the memory cells 320 or may be read from the memory cells 320 based on voltages applied into the bit-lines BL1 through BLn and the word-lines WL1 through WLm by the column decoder and the row decoder, respectively.

The semiconductor memory cell array 300 may be a DRAM cell array as illustrated in FIG. 4. The semiconductor memory cell array 300 in the DRAM device may be implemented as one of an open bit-line structure or a folded bit-line structure. Because the semiconductor memory cell array 300 shown in FIG. 4 is one example embodiment, the structure of the semiconductor memory cell array 300 is not limited thereto.

In the semiconductor memory cell array 300, the bit-lines BL1 through BLn cross the word-lines WL1 through WLm. The memory cells 320 are at intersections of the bit-lines BL1 through BLn and the word-lines WL1 through WLm. The dummy memory cells 340 are intersections of the first dummy bit-lines 1ST DBL1 and 1ST DBL2 and the dummy word-lines DWL1 and DWL2, of the second dummy bit-lines 2ND DBL1 through 2ND DBL4 and the dummy word-lines DWL1 and DWL2, of the first dummy bit-lines 1ST DBL1 and 1ST DBL2 and the word-lines WL1 through WLm, of the second dummy bit-lines 2ND DBL1 through 2ND DBL4 and the word-lines WL1 through WLm, and of the bit-lines BL1 through BLn and the dummy word-lines DWL1 and DWL2. That is, the first dummy bit-lines 1ST DBL1 and 1ST DBL2, the second dummy bit-lines 2ND DBL1 through 2ND DBL4, the dummy word-lines DWL1 and DWL2, and the dummy memory cells 340 are arranged in edge regions of the semiconductor memory cell array 300, while the bit-lines BL1 through BLn, the word-lines WL1 through WLm, and the memory cells 320 are arranged in central regions of the semiconductor memory cell array 300.

In the semiconductor memory cell array 300, the first dummy bit-lines 1ST DBL1 and 1ST DBL2 are in outer regions of the bit-lines BL1 through BLn and parallel to the bit-lines BL1 through BLn. The second dummy bit-lines 2ND DBL1 through 2ND DBL4 are in outer regions of the first dummy bit-lines 1ST DBL1 and 1ST DBL2 and parallel to the bit-lines BL1 through BLn. The dummy word-lines DWL1 and DWL2 are in outer regions of the word-lines WL1 through WLm and parallel to the word-lines WL1 through WLm.

In accordance with embodiments, an internal voltage (e.g., a bias voltage provided through a power line) is applied into the first dummy bit-lines 1ST DBL1 and 1ST DBL2. The second dummy bit-lines 2ND DBL1 through 2ND DBL4 are maintained in a floating state. A turn-off voltage is applied into the dummy word-lines DWL1 and DWL2 to maintain the dummy memory cells 340 coupled to the dummy word-lines DWL1 and DWL2 in a turn-off state.

Further, the sub-dummy memory cells 360 are at intersections of the bit-lines BL1 through BLn and the dummy word-lines DWL1 and DWL2. A junction floating 362 is conducted between the sub-dummy memory cells 360 and the bit-lines BL1 through BLn. For example, the sub-dummy memory cells 360 among the dummy memory cells 340 may be electrically separated from the bit-lines BL1 through BLn.

The dummy memory cells 340 coupled to the dummy word-lines DWL1 and DWL2 receive the turn-off voltage. That is, the turn-off voltage is applied into third terminals (e.g., gate terminals) of transistors in the dummy memory cells 340 coupled to the dummy word-lines DWL1 and DWL2. Thus, the dummy memory cells 340 coupled to the dummy word-lines DWL1 and DWL2 are maintained in the turn-off state. As first terminals (e.g., drain terminals) of transistors in the dummy memory cells 340 are coupled to the second dummy bit-lines 2ND DBL1 through 2ND DBL4 that are maintained in the floating state, the dummy memory cells 340 coupled to the second dummy bit-lines 2ND DBL1 through 2ND DBL4 are maintained in the floating state. Further, as the junction floating 362 is conducted between the sub-dummy memory cells 360 and the bit-lines BL1 through BLn, influences between the sub-dummy memory cells 360 and the bit-lines BL1 through BLn may be prevented. That is, cross-talk between the sub-dummy memory cells 360 and the bit-lines BL1 through BLn may be reduced or prevented.

As a result, the dummy memory cells 340 in the semiconductor memory cell array 300 may be prevented from performing unwanted write operations and/or unwanted read operations. In addition, the dummy memory cells 340, the first dummy bit-lines 1ST DBL1 and 1ST DBL2, the second dummy bit-lines 2ND DBL1 through 2ND DBL4, and the dummy word-lines DWL1 and DWL2 may not negatively influence operations of the memory cells 320 in the semiconductor memory cell array 300. As the dummy memory cells 340 coupled to the first dummy bit-lines 1ST DBL1 and 1ST DBL2 receive the internal voltage, the dummy memory cells 340 coupled to the first dummy bit-lines 1ST DBL1 and 1ST DBL2 may be used for various purposes. For example, the dummy memory cells 340 coupled to the first dummy bit-lines 1ST DBL1 and 1ST DBL2 may be used for testing the memory cells 320 in the semiconductor memory cell array 300.

Figure 5:
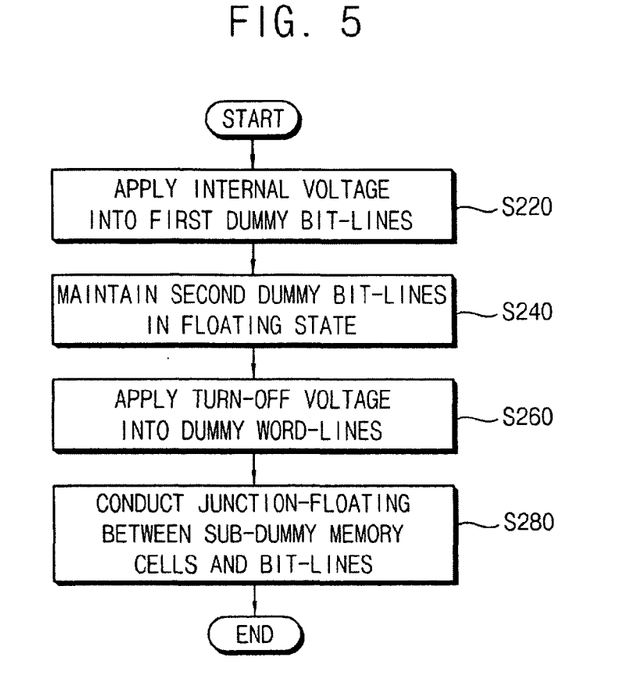
FIG. 5 illustrates a flow chart of a method of reducing noise caused by dummy word-lines, dummy bit-lines, and/or dummy memory cells in the semiconductor memory cell of FIG. 4.

FIG. 5 illustrates a flow chart of a method of reducing noise caused by dummy word-lines, dummy bit-lines, and/or dummy memory cells in the semiconductor memory cell 300 of FIG. 4 in accordance with embodiments.

Referring to FIG. 5, in the method of reducing the noise caused by the dummy word-lines DWL1 and DWL2, the first dummy bit-lines 1ST DBL1 and 1ST DBL2, the second dummy bit-lines 2ND DBL1 through 2ND DBL4, and/or the dummy memory cells 340 in the semiconductor memory cell 300, the internal voltage may be applied into the first dummy bit-lines 1ST DBL1 and 1ST DBL2 (operation S220). The second dummy bit-lines 2ND DBL1 through 2ND DBL4 may be maintained in the floating state (operation S240). The turn-off voltage may be applied into the dummy word-lines DWL1 and DWL2 (operation S260). The junction floating 362 may be conducted between the sub-dummy memory cells 360 and the bit-lines BL1 through BLn (operation S280).

The internal voltage (e.g., the bias voltage provided through the power line) is applied into the first dummy bit-lines 1ST DBL1 and 1ST DBL2 (operation S220). The second dummy bit-lines 2ND DBL1 through 2ND DBL4 are maintained in the floating state (operation S240). Thus, the dummy memory cells 340 coupled to the second dummy bit-lines 2ND DBL1 through 2ND DBL4 may be maintained in the floating state.

In addition, the turn-off voltage is applied into the dummy word-lines DWL1 and DWL2 (operation S260). Thus, the dummy memory cells 340 coupled to the dummy word-lines DWL1 and DWL2 may be maintained in the turn-off state.

Further, the junction floating 362 is conducted between the sub-dummy memory cells 360 and the bit-lines BL1 through BLn (operation S280). Thus, cross-talk between the sub-dummy memory cells 360 and the bit-lines BL1 through BLn may be reduced or prevented. For example, the junction floating 362 may be conducted by electrically separating the sub-dummy memory cells 360 from the bit-lines BL1 through BLn.

As described above, as the dummy memory cells 340 coupled to the first dummy bit-lines 1ST DBL1 and 1ST DBL2 receive the internal voltage, the dummy memory cells 340 coupled to the first dummy bit-lines 1ST DBL1 and 1ST DBL2 may be used for various purposes. For example, the dummy memory cells 340 coupled to the first dummy bit-lines 1 ST DBL1 and 1ST DBL2 may be used for testing the memory cells 320 in the semiconductor memory cell array 300. The method of FIG. 5 may prevent operation failures of the memory cells 320 in the semiconductor memory cell array 300 by reducing noise caused by the dummy word-line DWL1 and DWL2, the first dummy bit-lines 1ST DBL1 and 1ST DBL2, the second dummy bit-lines 2ND DBL1 through 2ND DBL4, and/or the dummy memory cells 340.

Figure 6:
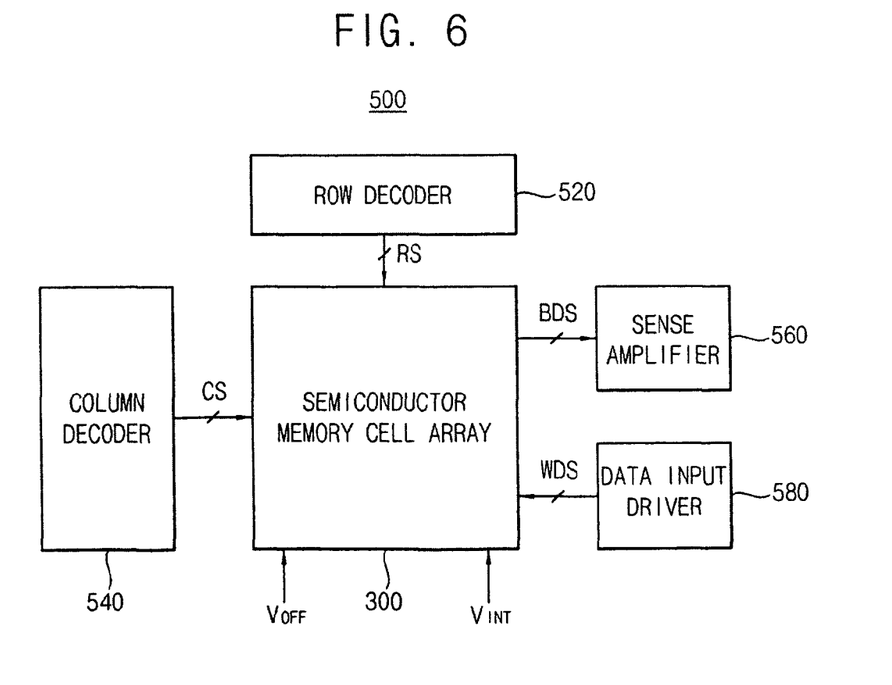
FIG. 6 illustrates a block diagram of a semiconductor memory device having the semiconductor memory cell array of FIG. 4.

FIG. 6 illustrates a block diagram of a semiconductor memory device 500 having the semiconductor memory cell array 300 of FIG. 4 according to embodiments. Referring to FIG. 6, the semiconductor memory device 500 may include the semiconductor memory cell array 300, a row decoder 520, a column decoder 540, a sense amplifier 560, and a data input driver 580.

As illustrated in FIG. 4, the semiconductor memory cell array 300 includes the bit-lines BL1 through BLn, the word-lines WL1 through WLm, the memory cells 320, the dummy memory cells 340, the first dummy bit-lines 1ST DBL1 and 1ST DBL2, the second dummy bit-lines 2ND DBL1 through 2ND DBL4, and the dummy word-lines DWL1 and DWL2. The dummy memory cells 340 include the sub-dummy memory cells 360. The first dummy bit-lines 1ST DBL1 and 1ST DBL2 are formed in outer regions of the bit-lines BL1 through BLn. The first dummy bit-lines 1ST DBL1 and 1ST DBL2 are coupled to the power line. The first dummy bit-lines 1ST DBL1 and 1ST DBL2 are dummy bit-lines that are adjacent to the bit-lines BL1 through BLn. The second dummy bit-lines 2ND DBL1 through 2ND DBL4 are in outer regions of the first dummy bit-lines 1ST DBL1 and 1ST DBL2 and parallel to the bit-lines BL1 through BLn. The dummy word-lines DWL1 and DWL2 are in outer regions of the word-lines WL1 through WLm and parallel to the word-lines WL1 through WLm. The sub-dummy memory cells 360 are at intersections of the bit-lines BL1 through BLn and the dummy word-lines DWL1 and DWL2. That is, the sub-dummy memory cells 360 are a portion of the dummy memory cells 340.

In accordance with embodiments, the first dummy bit-lines 1ST DBL1 and 1ST DBL2 receive the internal voltage through the power line. The second dummy bit-lines 2ND DBL1 through 2ND DBL4 are maintained in the floating state. The dummy word-lines DWL1 and DWL2 retain the turn-off voltage. Here, further description of the semiconductor memory cell array 300 will be omitted because the semiconductor memory cell array 300 is described in detail above.

The row decoder 520 selects one among the word-lines WL1 through WLm to output a word-line selection signal RS to the semiconductor memory cell array 300. The column decoder 540 selects one among the bit-lines BL1 through BLn to output a bit-line selection signal CS to the semiconductor memory cell array 300. Thus, one of the memory cells 340 is selected by the word-line selection signal RS from the row decoder 520 and the bit-line selection signal CS from the column decoder 540. The sense amplifier 560 reads data BDS from one memory cell selected by the row decoder 520 and the column decoder 540. The data input driver 580 writes data WDS into one memory cell selected by the row decoder 520 and the column decoder 540. According to some example embodiments, the sense amplifier 560 may perform the functions of the data input driver 580. Here, the further descriptions of the row decoder 520, the column decoder 540, the sense amplifier 560, and the data input driver 580 will be omitted because the operations of the row decoder 520, the column decoder 540, the sense amplifier 560, and the data input driver 580 are well-known in the art.

As described above, the semiconductor memory device 500 may achieve high operation reliability because the semiconductor memory cell array 300 reduces noise caused by the dummy word-lines DWL1 and DWL2, the first dummy bit-lines 1ST DBL1 and 1ST DBL2, the second dummy bit-lines 2ND DBL1 through 2ND DBL4, and/or the dummy memory cells 340 when the semiconductor memory device 500 operates using a low operation voltage.

Figure 7:
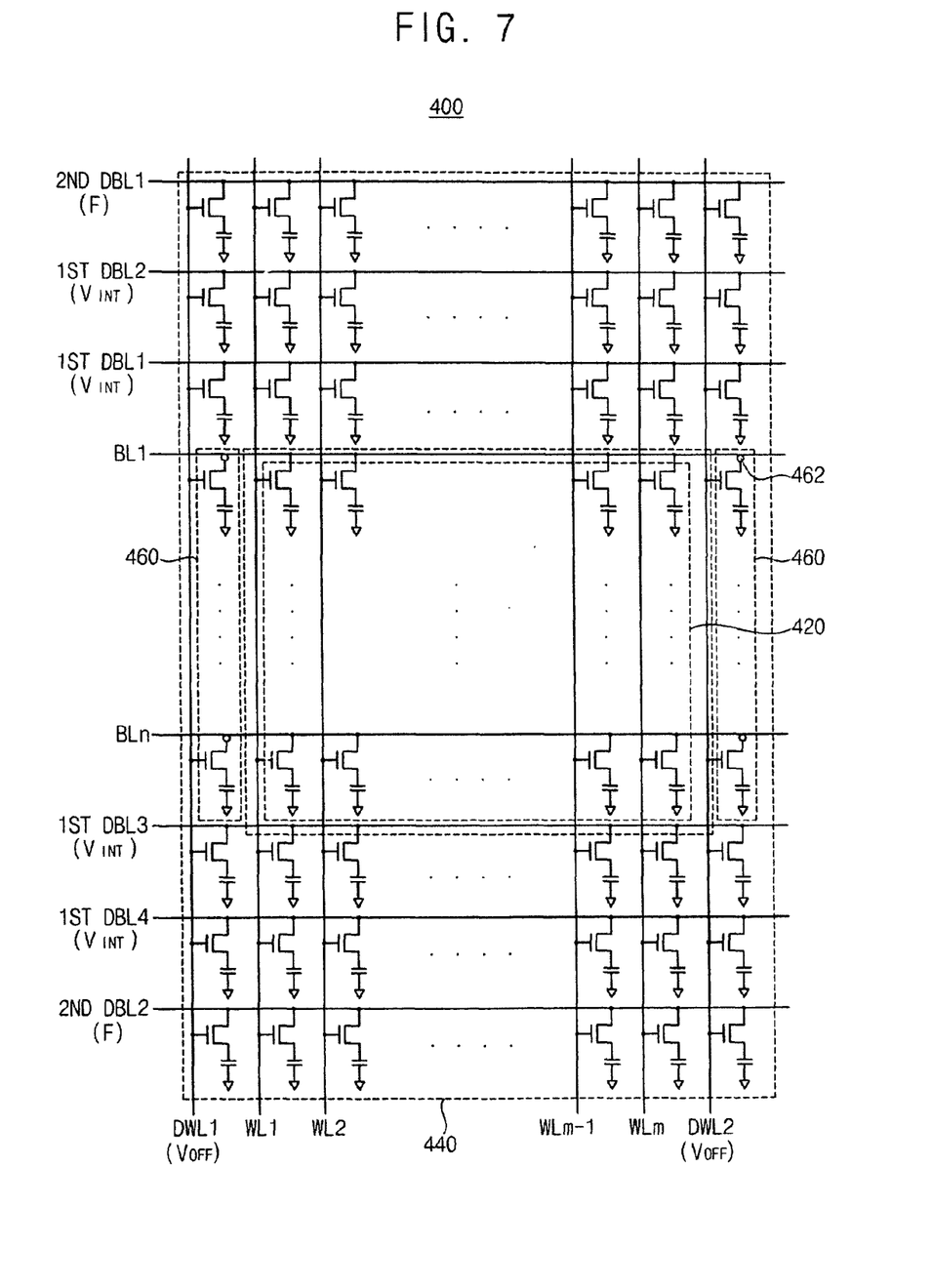
FIG. 7 illustrates a circuit diagram of a semiconductor memory cell array according to some example embodiments.

FIG. 7 illustrates a circuit diagram of a semiconductor memory cell array 400 according to some example embodiments. Referring FIG. 7, the semiconductor memory cell array 400 may include a plurality of bit-lines BL1 through BLn, a plurality of word-lines WL1 through WLm, a plurality of memory cells 420, a plurality of dummy memory cells 440, a plurality of first dummy bit-lines 1ST DBL1 through 1ST DBL4, a plurality of second dummy bit-lines 2ND DBL1 and 2ND DBL2, and a plurality of dummy word-lines DWL1 and DWL2. The dummy memory cells 440 may include a plurality of sub-dummy memory cells 460 at intersections of the bit-lines BL1 through BLn and the dummy word-lines DWL1 and DWL2.

The memory cells 420 may be at intersections of the bit-lines BL1 through BLn and the word-lines WL1 through WLm. One of the memory cells 420 may be selected by a column decoder and a row decoder. In detail, data may be written into the memory cells 420 or may be read from the memory cells 420 based on voltages applied into the bit-lines BL1 through BLn and the word-lines WL1 through WLm by the column decoder and the row decoder.

The semiconductor memory cell array 400 may be a DRAM cell array as illustrated in FIG. 7. The semiconductor memory cell array 400 in the DRAM device may be implemented as one of an open bit-line structure or a folded bit-line structure. Because the semiconductor memory cell array 400 shown in FIG. 7 is one example embodiment, the structure of the semiconductor memory cell array 400 is not limited thereto.

In the semiconductor memory cell array 400, the bit-lines BL1 through BLn cross the word-lines WL1 through WLm. The memory cells 420 are at intersections of the bit-lines BL1 through BLn and the word-lines WL1 through WLm. The dummy memory cells 440 are at intersections of the first dummy bit-lines 1ST DBL1 through 1ST DBL4 and the dummy word-lines DWL1 and DWL2, of the second dummy bit-lines 2ND DBL1 and 2ND DBL2 and the dummy word-lines DWL1 and DWL2, of the first dummy bit-lines 1ST DBL1 through 1ST DBL4 and the word-lines WL1 through WLm, of the second dummy bit-lines 2ND DBL1 and 2ND DBL2 and the word-lines WL1 through WLm, and of the bit-lines BL1 through BLn and the dummy word-lines DWL1 and DWL2. That is, the first dummy bit-lines 1ST DBL1 through 1ST DBL4, the second dummy bit-lines 2ND DBL1 and 2ND DBL2, the dummy word-lines DWL1 and DWL2, and the dummy cells 440 are arranged in edge regions of the semiconductor memory cell array 400 while the bit-lines BL1 through BLn, the word-lines WL1 through WLm, and the memory cells 420 are arranged in central regions of the semiconductor memory cell array 400.

In the semiconductor memory cell array 400, the first dummy bit-lines 1ST DBL1 through 1ST DBL4 are in outer regions of the bit-lines BL1 through BLn and parallel to the bit-lines BL1 through BLn. The second dummy bit-lines 2ND DBL1 and 2ND DBL2 are in outer regions of the first dummy bit-lines 1ST DBL1 through 1ST DBL4 and parallel to the bit-lines BL1 through BLn. The dummy word-lines DWL1 and DWL2 are in outer regions of the word-lines WL1 through WLm and parallel to the word-lines WL1 through WLm. Further, the sub-dummy memory cells 460 are at intersections of the bit-lines BL1 through BLn and the dummy word-lines DWL1 and DWL2.

In accordance with embodiments, an internal voltage (e.g., a bias voltage provided through a power line) is applied into the first dummy bit-lines 1ST DBL1 through 1ST DBL4. The second dummy bit-lines 2ND DBL1 and 2ND DBL2 are maintained in a floating state. A turn-off voltage VOFF is applied into the dummy word-lines DWL1 and DWL2 to maintain the dummy memory cells 440 coupled to the dummy word-lines DWL1 and DWL2 in a turn-off state. A junction floating 462 is conducted between the sub-dummy memory cells 460 and the bit-lines BL1 through BLn. For example, the sub-dummy memory cells 460 among the dummy memory cells 440 may be electrically separated from the bit-lines BL1 through BLn.

In accordance with embodiments, the dummy memory cells 440 coupled to the dummy word-lines DWL1 and DWL2 receive the turn-off voltage. The turn-off voltage VOFF is applied into gate terminals of transistors in the dummy memory cells 440 coupled to the dummy word-lines DWL1 and DWL2. Thus, the dummy memory cells 440 coupled to the dummy word-lines DWL1 and DWL2 may be maintained in the turn-off state. As first terminals (e.g., drain terminals) of transistors in the dummy memory cells 440 are coupled to the second dummy bit-lines 2ND DBL1 and 2ND DBL2 that are maintained in the floating state, the dummy memory cells 440 coupled to the second dummy bit-lines 2ND DBL1 and 2ND DBL2 are maintained in the floating state. Further, as the junction floating 462 is conducted between the sub-dummy memory cells 460 and the bit-lines BL1 through BLn, influence between the sub-dummy memory cells 460 and the bit-lines BL1 through BLn may be reduced or prevented. That is, cross-talk between the sub-dummy memory cells 460 and the bit-lines BL1 through BLn may be reduced or prevented. As a result, the dummy memory cells 440 in the semiconductor memory cell array 400 may be prevented from performing unwanted write operations and/or unwanted read operations. In addition, the dummy memory cells 440, the first dummy bit-lines 1ST DBL1 through 1ST DBL4, the second dummy bit-lines 2ND DBL1 and 2ND DBL2, and the dummy word-lines DWL1 and DWL2 may not negatively influence operations of the memory cells 420 in the semiconductor memory cell array 400. As the dummy memory cells 440 coupled to the first dummy bit-lines 1ST DBL1 through 1ST DBL4 receive the internal voltage, the dummy memory cells 440 coupled to the first dummy bit-lines 1ST DBL1 through 1ST DBL4 may be used for various purposes. For example, the dummy memory cells 440 coupled to the first dummy bit-lines 1ST DBL1 through 1ST DBL4 may be used for testing the memory cells 420 in the semiconductor memory cell array 400.

In a method of reducing noise caused by the dummy word-lines DWL1 and DWL2, the first dummy bit-lines 1ST DBL1 through 1ST DBL4, the second dummy bit-lines 2ND DBL1 and 2ND DBL2, and/or the dummy memory cells 440 in the semiconductor memory cell 400, the internal voltage may be applied into the first dummy bit-lines 1ST DBL1 through 1ST DBL4. The second dummy bit-lines 2ND DBL1 and 2ND DBL2 may be maintained in the floating state. The turn-off voltage may be applied into the dummy word-lines DWL1 and DWL2. The junction floating 462 may be conducted between the sub-dummy memory cells 460 and the bit-lines BL1 through BLn.

The internal voltage (e.g., the bias voltage provided through the power line) is applied into the first dummy bit-lines 1ST DBL1 through 1ST DBL4. The second dummy bit-lines 2ND DBL1 and 2ND DBL2 are maintained in the floating state. Thus, the dummy memory cells 440 coupled to the second dummy bit-lines 2ND DBL1 and 2ND DBL2 may be maintained in the floating state. In addition, the turn-off voltage is applied into the dummy word-lines DWL1 and DWL2. Thus, the dummy memory cells 440 coupled to the dummy word-lines DWL1 and DWL2 may be maintained in the turn-off state. Further, the junction floating 462 is conducted between the sub-dummy memory cells 460 and the bit-lines BL1 through BLn. Thus, cross-talk between the sub-dummy memory cells 460 and the bit-lines BL1 through BLn may be reduced or prevented. For example, the junction floating 462 may be conducted by electrically separating the sub-dummy memory cells 460 from the bit-lines BL1 through BLn.

As described above, as the dummy memory cells 440 coupled to the first dummy bit-lines 1ST DBL1 through 1ST DBL4 receive the internal voltage, the dummy memory cells 440 coupled to the first dummy bit-lines 1ST DBL1 through 1ST DBL4 may be used for various purposes. For example, the dummy memory cells 440 coupled to the first dummy bit-lines 1ST DBL1 through 1ST DBL4 may be used for testing the memory cells 420 in the semiconductor memory cell array 400.

In a semiconductor memory device including the semiconductor memory cell array 400, the semiconductor memory cell array 400 includes the bit-lines BL1 through BLn, the word-lines WL1 through WLm, the memory cells 420, the dummy memory cells 440, the first dummy bit-lines 1ST DBL1 through 1ST DBL4, the second dummy bit-lines 2ND DBL1 and 2ND DBL2, and the dummy word-lines DWL1 and DWL2. The dummy memory cells 440 include the sub-dummy memory cells 460. The first dummy bit-lines 1ST DBL1 through 1ST DBL4 are formed in outer regions of the bit-lines BL1 through BLn. The first dummy bit-lines 1ST DBL1 through 1ST DBL4 are coupled to the power line. The second dummy bit-lines 2ND DBL1 and 2ND DBL2 are dummy bit-lines that are away farthest from the bit-lines BL1 through BLn. The sub-dummy memory cells 460 are at intersections of the bit-lines BL1 through BLn and the dummy word-lines DWL1 and DWL2. That is, the sub-dummy memory cells 460 are a portion of the dummy memory cells 440. The first dummy bit-lines 1ST DBL1 through 1ST DBL4 receive the internal voltage through the power line. The second dummy bit-lines 2ND DBL1 and 2ND DBL2 are maintained in the floating state. The dummy word lines DWL1 and DWL2 retain the turn-off voltage.

In addition, a row decoder selects one among the word-lines WL1 through WLm to output a word-line selection signal RS to the semiconductor memory cell array 400. A column decoder selects one among the bit-lines BL1 through BLn to output a bit-line selection signal CS to the semiconductor memory cell array 400. Thus, one of the memory cells 440 is selected by the word-line selection signal RS from the row decoder and the bit-line selection signal CS from the column decoder. A sense amplifier reads data BDS from one memory cell selected by the row decoder and the column decoder. A data input driver writes data WDS into one memory cell selected by the row decoder and the column decoder. According to some example embodiments, the sense amplifier may perform the functions of the data input driver.

As described above, the semiconductor memory device including the semiconductor memory cell array 400 may achieve high operation reliability because the semiconductor memory cell array 400 reduces noise caused by the dummy word-lines DWL1 and DWL2, the first dummy bit-lines 1ST DBL1 through 1ST DBL4, the second dummy bit-lines 2ND DBL1 and 2ND DBL2, and/or the dummy memory cells 440 when the semiconductor memory device operates using a low operation voltage.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory cell array, comprising:
a plurality of bit-lines;
a plurality of word-lines;
a plurality of memory cells at intersections of the bit-lines and the word-lines;
a plurality of dummy memory cells arranged in edge regions of the semiconductor memory cell array;
a plurality of dummy bit-lines in outer regions of the bit-line, the dummy bit-lines being configured to be maintained in a floating state;
a plurality of dummy word-lines in outer regions of the word-lines, the dummy word-lines being configured to receive a turn-off voltage; and
a plurality of additional dummy bit-lines configured to receive an internal voltage.

2. The semiconductor memory cell array as claimed in claim 1, wherein the dummy memory cells coupled to the dummy bit-lines are maintained in the floating state.

3. The semiconductor memory cell array as claimed in claim 1, wherein the dummy memory cells coupled to the dummy word-lines are maintained in a turn-off state.

4. The semiconductor memory cell array as claimed in claim 1, wherein the dummy memory cells include a plurality of sub-dummy memory cells at intersections of the bit-lines and the dummy word-lines, a junction floating being conducted between the sub-dummy memory cells and the bit-lines.

5. The semiconductor memory cell array as claimed in claim 1, wherein the semiconductor memory cell array is a dynamic random access memory (DRAM) memory cell array.

6. The semiconductor memory cell array as claimed in claim 5, wherein the semiconductor memory cell array is implemented as one of an open bit-line structure and a folded bit-line structure.

7. The semiconductor memory cell array as claimed in claim 1, wherein the additional dummy bit-lines are between the outer regions of the bit-lines and the plurality of dummy bit-lines.

8. The semiconductor memory cell array as claimed in claim 1, wherein the additional dummy bit-lines are adjacent to the bit-lines.

9. The semiconductor memory cell array as claimed in claim 1, wherein the dummy bit-lines are further from the bit-lines than the additional dummy bit-lines.

10. The semiconductor memory cell array as claimed in claim 9, wherein the semiconductor memory cell array is a dynamic random access memory (DRAM) memory cell array.

11. The semiconductor memory cell array as claimed in claim 10, wherein the semiconductor memory cell array is implemented as one of an open bit-line structure and a folded bit-line structure.

12. A semiconductor memory device, comprising:
a semiconductor memory cell array;
a row decoder configured to determine a word-line for selecting a memory cell;
a column decoder configured to determine a bit-line for selecting a memory cell;
a sense amplifier configured to read data from a memory cell selected by the row decoder and the column decoder; and
a data input driver configured to write data into a memory cell selected by the row decoder and the column decoder,
wherein the semiconductor memory cell array includes:
a plurality of bit-lines;
a plurality of word-lines;
a plurality of memory cells at intersections of the bit-lines and the word-lines;
a plurality of dummy memory cells arranged in edge regions of the semiconductor memory cell array;
a plurality of dummy bit-lines in outer regions of the bit-line, the dummy bit-lines being configured to be maintained in a floating state;
a plurality of dummy word-lines in outer regions of the word-lines, the dummy word-lines being configured to receive a turn-off voltage; and
a plurality of additional dummy bit-lines configured to receive an internal voltage.

13. The semiconductor memory device claim 12, wherein the dummy memory cells coupled to the dummy bit-lines are maintained in the floating state, and wherein the dummy memory cells coupled to the dummy word-lines are maintained in a turn-off state.

14. The semiconductor memory device as claimed in claim 12, wherein the dummy memory cells include a plurality of sub-dummy memory cells at intersections of the bit-lines and the dummy word-lines, a junction floating being conducted between the sub-dummy memory cells and the bit-lines.

* * * * *